United States Patent

[11] 3,558,925

[72] Inventor Howard Lawrence Broverman
Pittsfield, Mass.
[21] Appl. No. 791,030
[22] Filed Jan. 14, 1969
[45] Patented Jan. 26, 1971
[73] Assignee General Electric Company
a corporation of New York

[54] LOW RIPPLE DOUBLE DEMODULATOR SUBJECT TO INTEGRATION
9 Claims, 16 Drawing Figs.

[52] U.S. Cl. ........................................................ 307/261, 307/240; 328/26
[51] Int. Cl. ........................................................ H03k 5/00
[50] Field of Search ........................................... 328/26, 32; 307/230, 229, 240, 242, 261; 329/166; 321/6

[56] References Cited
UNITED STATES PATENTS
2,668,910 2/1954 Starr ............................. 328/26X

*Primary Examiner*—Roy Lake
*Assistant Examiner*—James B. Mullins
*Attorneys*—John F. McDevitt, Frank L. Neuhauser, Melvin M. Goldenberg and Oscar B. Waddell

ABSTRACT: A double demodulation and amplification circuit comprising a pair of first alternately operable switching transistors coupled to and controlled by the direct and inverse outputs of a first switching potential. A summing amplifier is provided having direct and inverting input terminals and an output terminal. A first input circuit having two paths supplies a first input variable magnitude control signal to be demodulated to the respective direct and inverting input terminals of the summing amplifier, and the pair of first first switching transistors are connected across this first input circuit and are rendered alternately conductive by the first switching potential. A pair of second alternately operable switching transistors are coupled to and controlled by a second switching potential having the same wave form as the first switching potential but shifted 90° in phase with respect thereto. A second input circuit having two separate paths is provided for supplying a second input variable magnitude control signal to the respective direct and inverting input terminals of the summing amplifier with the second input control signal being similar to the first input control signal but phase shifted 90° with respect thereto. The second pair of switching transistors are connected across the second input circuit and are rendered alternately conductive by the second switching potential whereby a summation of full wave rectified and amplified control signals is obtained from the output of the summing amplifier with improved ripple content and low filtering requirements.

INVENTOR
HOWARD L. BROVERMAN

BY J F McDevitt
HIS ATTORNEY

INVENTOR
HOWARD L. BROVERMAN

BY J. F. McDevitt
HIS ATTORNEY

INVENTOR
HOWARD L. BROVERMAN
BY J.F. McDevitt
HIS ATTORNEY

PATENTED JAN 26 1971

3,558,925

INVENTOR
HOWARD L. BROVERMAN

BY J.F. McDevitt
HIS ATTORNEY

LOW RIPPLE DOUBLE DEMODULATOR SUBJECT TO INTEGRATION

BACKGROUND OF INVENTION

1. Field of Invention

This invention relates to a new and improved double demodulation and amplification circuit having low ripple content in its output, and which is subject to fabrication using microminiaturized, integrated circuit techniques.

More particularly, the invention relates to a new and improved, integrable, double demodulator which can be fabricated without requiring input or output transformers, or the conventional large filter capacitors, and hence can be used to extend the band width, and improve the stability of gimbal servosystems, etc., in which it is employed for the reason that it requires less lag filtering. The new and improved double demodulator can be fabricated in a single, monolithic, mircominiaturized, integrated circuit chip so that it becomes extremely attractive not only from the standpoint of improved performance as noted above, but also from its potentially low cost and improved reliability.

2. Statement of Prior Art Problems

U.S. Pat. application Ser. No. 611,521 (General Electric patent docket 35-53 D-261), Howard L. Broverman, Inventor, entitled "Pulse Width Modulation Servoamplifier," filed Dec. 23, 1966, and now U.S. Pat. No. 3,471,759, discloses and claims a wide band width servoamplifier system including a novel transformerless, single demodulator. The present invention comprises a unique, double demodulator circuit which may be constructed without the use of transformers, and which provides low ripple content in its output. Because of this characteristic, the conventional output filter capacitor used at the output of the demodulator to smooth its output, may be eliminated completely, thereby allowing increased overall circuit microminiaturization. The circuit also serves to extend the bandwidth and improve the stability of an overall servosystem, etc., in which it is used in that it requires less lag filtering.

SUMMARY OF INVENTION

It is therefore a primary object of the invention to provide a new and improved double demodulation and amplification circuit having low output ripple, and which is subject to fabrication in microminiaturized, integrated circuit form.

In practicing the invention, a new and improved double demodulation and amplification circuit is provided which is comprised of a pair of first alternately operable switching means (transistors) coupled to and controlled by the direct and inverse outputs of a first switching potential. A summing amplifier is provided having direct and inverting input terminals and an output terminal. A first input circuit is provided having two paths for supplying a first input, variable magnitude, control signal to be demodulated and amplified to the respective direct and inverting input terminals of the summing amplifier. The pair of first switching means are connected across the first input circuit, and are rendered alternately conductive by the first switching potential. A pair of second, alternately operable, switching means (transistors) are coupled to and controlled by a second switching potential having the same wave form as the first switching potential, but shifted 90° in phase with respect thereto. A second input circuit having two paths is provided for supplying a second input, variable magnitude, control signal to the respective direct and inverting input terminals of the summing amplifier, with the second input control signal being similar to the first input control signal but phase shifted 90° with respect thereto. The pair of second switching means are connected across the second input circuit and are rendered alternately conductive by the second switching potential whereby a summation of full wave rectified and amplified control signals is obtained from the output of the summing amplifier having improved ripple content and low filtering requirements.

BRIEF DESCRIPTION OF THE DRAWINGS

Other objects, features and many of the attendant advantages of this invention will be appreciated more readily as the same becomes better understood by reference to the following detailed description, when considered in connection with the accompanying drawings, wherein like parts in each of the several FIGS. are identified by the same reference character, and wherein.

DETAIL DESCRIPTION OF PREFERRED EMBODIMENTS

Figures 1, 1A, 1B:
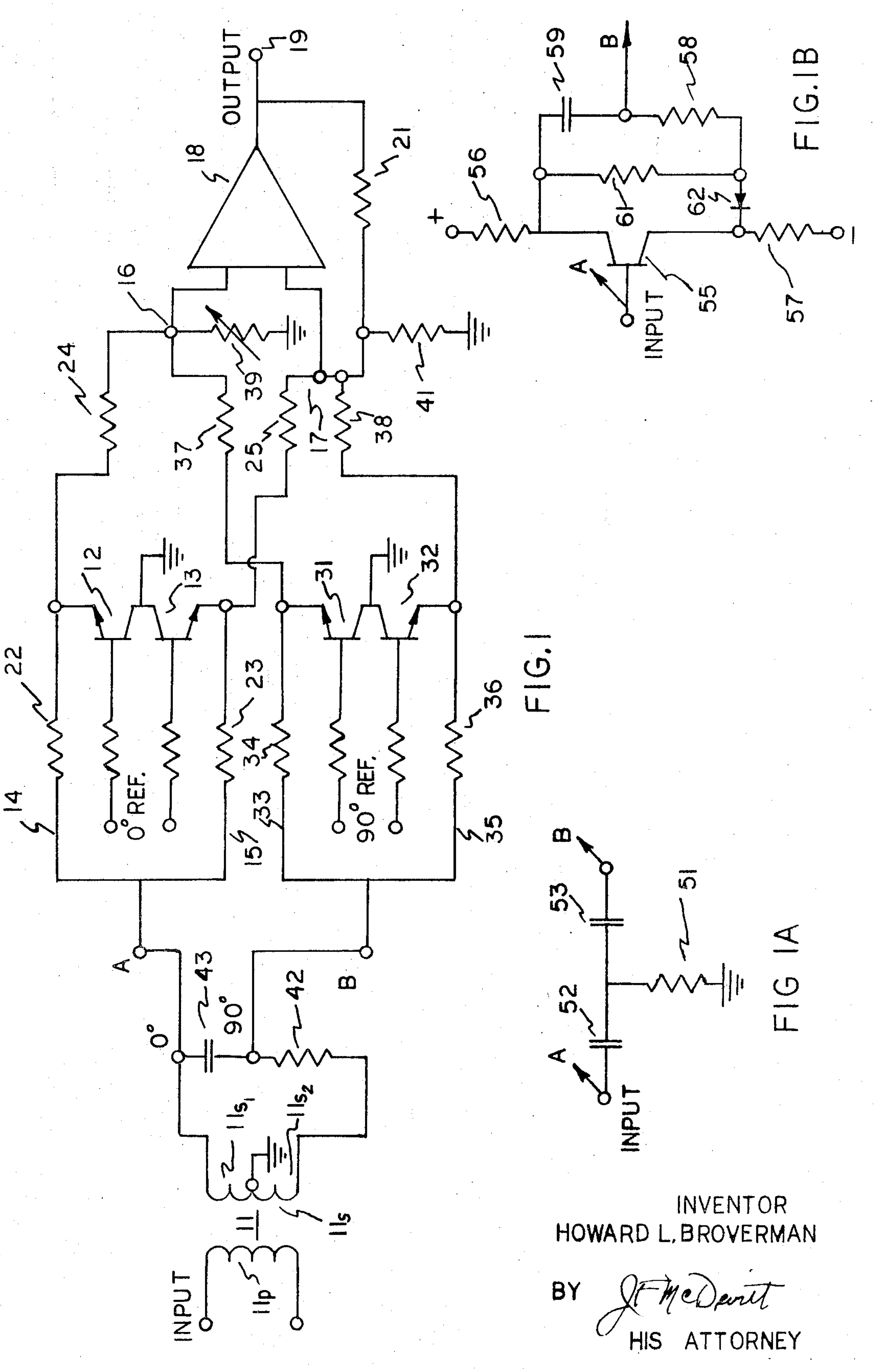
FIG. 1 is a schematic circuit diagram of a new and improved, low ripple, double demodulation and amplification circuit constructed in accordance with the invention.
FIG. 1A is an alternate input circuit for use with the low ripple double demodulator shown in FIG. 1.
FIG. 1B is a second alternate input circuit that can be used with the low ripple double demodulator of FIG. 1 to provide a higher input impedance characteristic.

FIG. 1 is a schematic circuit diagram of one form of a new and improved, low ripple, double demodulator constructed in accordance with the invention which utilizes a transformer or resolver shown generally at 11 for its input. The new and improved double demodulator in FIG. 1 is comprised by a pair of first, alternately operable switching means comprising transistors 12 and 13. The switching transistors 12 and 13, as well as the other switching transistors described hereinafter, can comprise conventional, commercially available NPN or PNP planar, epitaxal, switching transistors. The switching transistors 12 and 13 have their base electrode coupled to and controlled by the direct and inverse output of a source of square wave or sinusoidal waveshape switching potential (not shown) which provides a 0 degree phase shift reference used in operating the double demodulator. The collector electrodes of the pair of first switching transistors 12 and 13 are connected directly to ground, and the emitter electrodes of switching transistors 12 and 13 are connected to a first input circuit comprised by a circuit path 14 and a circuit path 15.

The first input circuit comprised by the two circuit paths 14 and 15 are connected to the direct and inverse input terminals 16 and 17, respectively, of a summing amplifier 18 having an output terminal 19. The summing amplifier 18 may comprise a conventional, commercially available, microminiaturized, monolithic, integrated circuit chip such as the micro 709 circuit manufactured and sold by the Fairchild Camera Company, Texas Instruments Corporation, Motorola, ITT, etc., and which constitutes a general purpose, differential or summing amplifier whose various contacts may be interconnected in a variety of circuit configurations to provide different functions. In the particular circuit configuration shown in FIG. 1, the direct input terminal 16 and inverse input terminal 17 as well as other appropriate circuit interconnections are arranged so that the monolithic circuit structure operates as a summing amplifier. To provide improved stability in the operation of the summing amplifier, a feedback path including a feedback resistor 21 may be interconnected between the output terminal 19 and the inverse input terminal 17.

The first input circuit comprised by the circuit paths 14 and 15 may include current-limiting resistors 22 and 23, respectively, for isolating the switching transistors 12 and 13 from a common, first source of input, variable magnitude, control signals. The common source of input, variable magnitude, control signals shown in FIG. 1 is comprised of a common control signal input transformer 11 or resolver having a primary winding $11p$ connected to a source of variable magnitude control signal, and inductively coupled to a secondary winding $11s$. The secondary winding $11s$ has an intermediate tap point returned to a reference potential source (ground). A direct or 0 degree phase shift connection is provided from the secondary winding path $11sl$ formed by one terminal of the secondary winding $11s$ and the first input circuit means comprised by the two circuit paths 14 and 15 and their interconnected current limiting resistors 22 and 23, respectively. The pair of switching transistors 12 and 13 are connected across the circuit paths 14 and 15 in the manner shown with the juncture of their interconnected collectors connected to the grounded source of reference potential. The switching transistors 12 and 13 are rendered alternately conductive by the direct and inverse output of the source of reference potential connected to their base electrode through suitable current limiting resistors. As a consequence, during alternate conducting intervals of the switching transistors 12 and 13, the respective input signals paths 14 and 15 of the first input circuit means are effectively returned to the grounded reference potential level. During the alternate nonconducting intervals of the switching transistors 12 and 13, the input, variable magnitude control signal will be effectively connected through either first input circuit path 14 or first input circuit path 15, alternately, to either the direct, or inverse input terminal of the summing amplifier 18.

The new and improved, low ripple, double demodulator shown in FIG. 1 also further includes a respective summing resistor 24 and 25 connected in each path of the first input circuit means intermediate the pair of first switching transistors 12 and 13 and the direct and inverse input terminal 16 and 17, respectively, of the summing amplifier 18. By this arrangement, the summing resistors 24 and 25 can serve to sum together the respective signal potentials supplied over the paths 14 and 15 to the respective direct and inverse input terminal of the summing amplifier, and further serve to buffer the input of the summing amplifier with respect to the operation of the first pair of switching transistors 12 and 13.

The double demodulator of FIG. 1 further includes a pair of second, alternately operable switching means comprised by NPN switching transistors 31 and 32 having their collector electrodes connected in common to a grounded source of reference potential. The base electrodes of the pair of second switching transistors 31 and 32 are connected to and controlled by the direct and inverse output of a second switching potential having the same wave form as the first switching potential supplied to the first switching transistors 12 and 13, but phase shifted 90° with respect thereto. The emitter electrodes of the second switching transistors 31 and 32 are connected across a second input circuit means comprised by a circuit path 33 including a current-limiting resistor 34 and a circuit path 35 including a current-limiting resistor 36. The second input circuit paths 33 and 35 are also connected through respective summing resistor 37 and 38 to the direct and inverse input terminal 16 and 17, respectively, of the summing amplifier 18. A common summing resistor 39 which may be variable or adjustable is connected between the direct input terminal 16 of summing amplifier 18 and ground, and serves to sum together the separate signal currents supplied over the paths 14 and 33, respectively, in the input of summing amplifier 18. Similarly, a common summing resistor 14 is connected intermediate the inverse input terminal 17 and ground for summing together the several currents supplied over the current paths 15 and 35 in the inverse input of summing amplifier 18.

The two circuit paths 33 and 35 comprising the second input circuit are connected in common to a second, input, variable magnitude control signal which is similar to the first, input control signal supplied to the first input comprised by the paths 14 and 15, but which is phase shifted 90° with respect to the first input control circuit. It will be appreciated therefore that the input, variable magnitude, control signal supplied to the primary winding $11p$ of signal transformer 11 is a common source of control signal with a 90° phase shift circuit being interposed in the second input circuit path intermediate the common source of control signal and the pair of second, alternately operable, switching transistors 31 and 32. For this purpose, a 90° phase shift circuit comprised by a resistor 42 and a capacitor 43 is connected intermediate the remaining winding portion $11s\,2$ of the secondary winding $11s$ of signal transformer 11 and the second input circuit comprised by the circuit paths 33 and 35.

Figure 3:
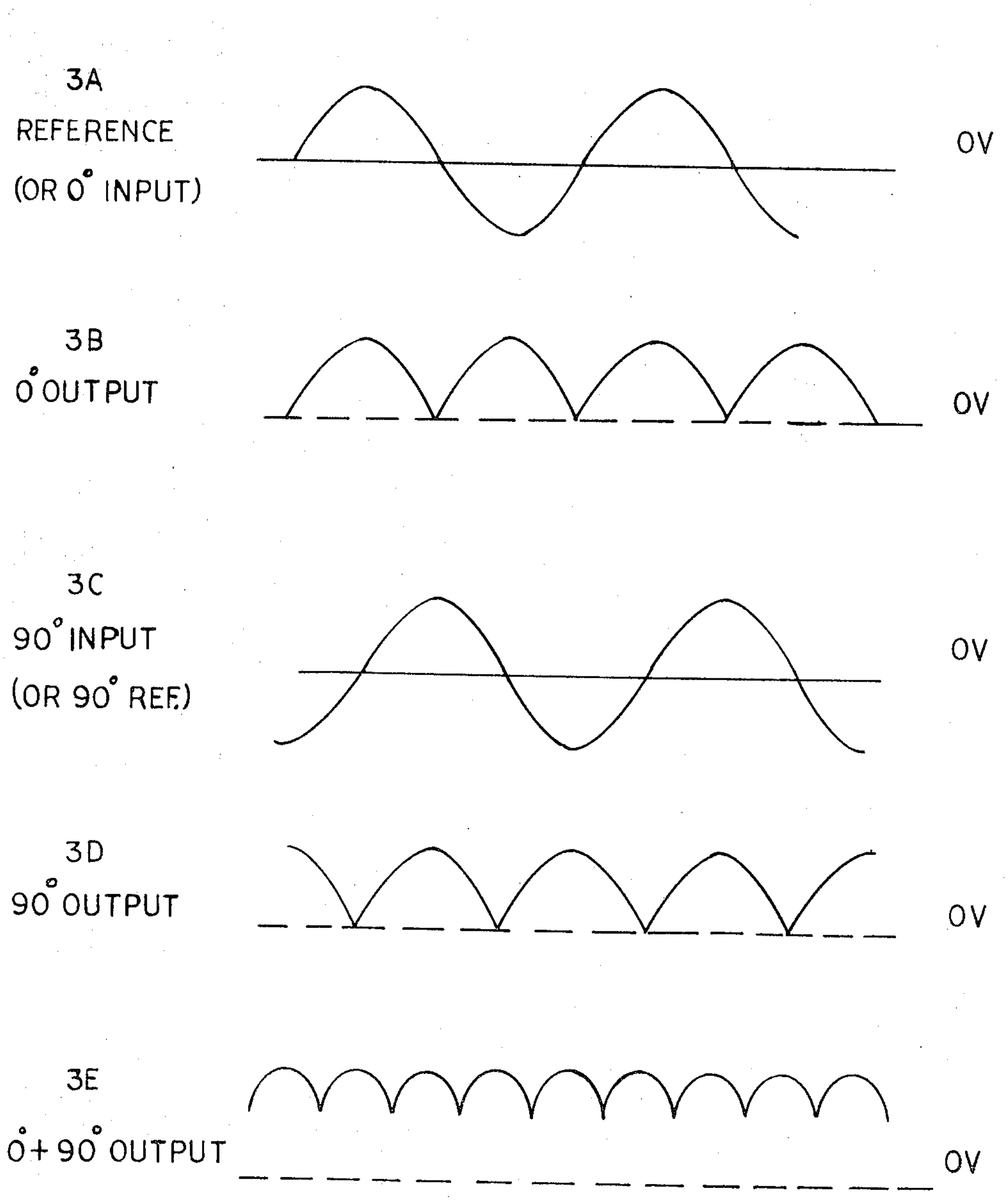
FIG. 3 is a series of voltage versus time waveforms illustrating the operating characteristics of the low ripple double demodulator comprising the invention.

The operation of the new and improved, low ripple, double demodulator shown in FIG. 1 can best be understood in connection with the waveforms illustrated in FIG. 3. FIG. 3A illustrates the sinusoidal waveform of the 0 degrees phase shift reference potential applied to the base of the switching transistors 12 and 13. As a result of this 0 degree reference switching potential, the switching transistors 12 and 13 will be rendered alternately conductive. Alternate conduction of the switching transistors 12 and 13 serves to alternately short the variable magnitude input control signals supplied through the circuit paths 14 and 15 to the direct and inverse terminals of the summing amplifier 18. Consequently, the output signal pulses appearing across the summing resistors 24 and 25 would have a combined wave shape due to the chopping action of switching transistors 12 and 13 as shown in FIG. 3B. FIG. 3C illustrates the 90° phase shifted sinusoidal reference switching potential supplied to the base of the pair of second switching transistors 31 and 32. From a comparison of FIG. 3C to FIG. 3A, it will be seen that two switching potentials have the same wave shape, but are phase shifted 90°. As a consequence of the chopping action of the pair of second switching transistors 31 and 32 on the 90° phase shifted input, variable magnitude control signal supplied over the circuit paths 33 and 35, the combined output appearing across the summing resistors 37 and 38 will have the form shown in FIG. 3D. By adding together the wave shapes shown in FIG. 3B and 3D, the resultant output wave form signal appearing at the output terminal 19 of summing amplifier 18 will have a wave shape such as shown in FIG. 3E. Signal to noise ratio is increased by factor of 10.

Figure 4:
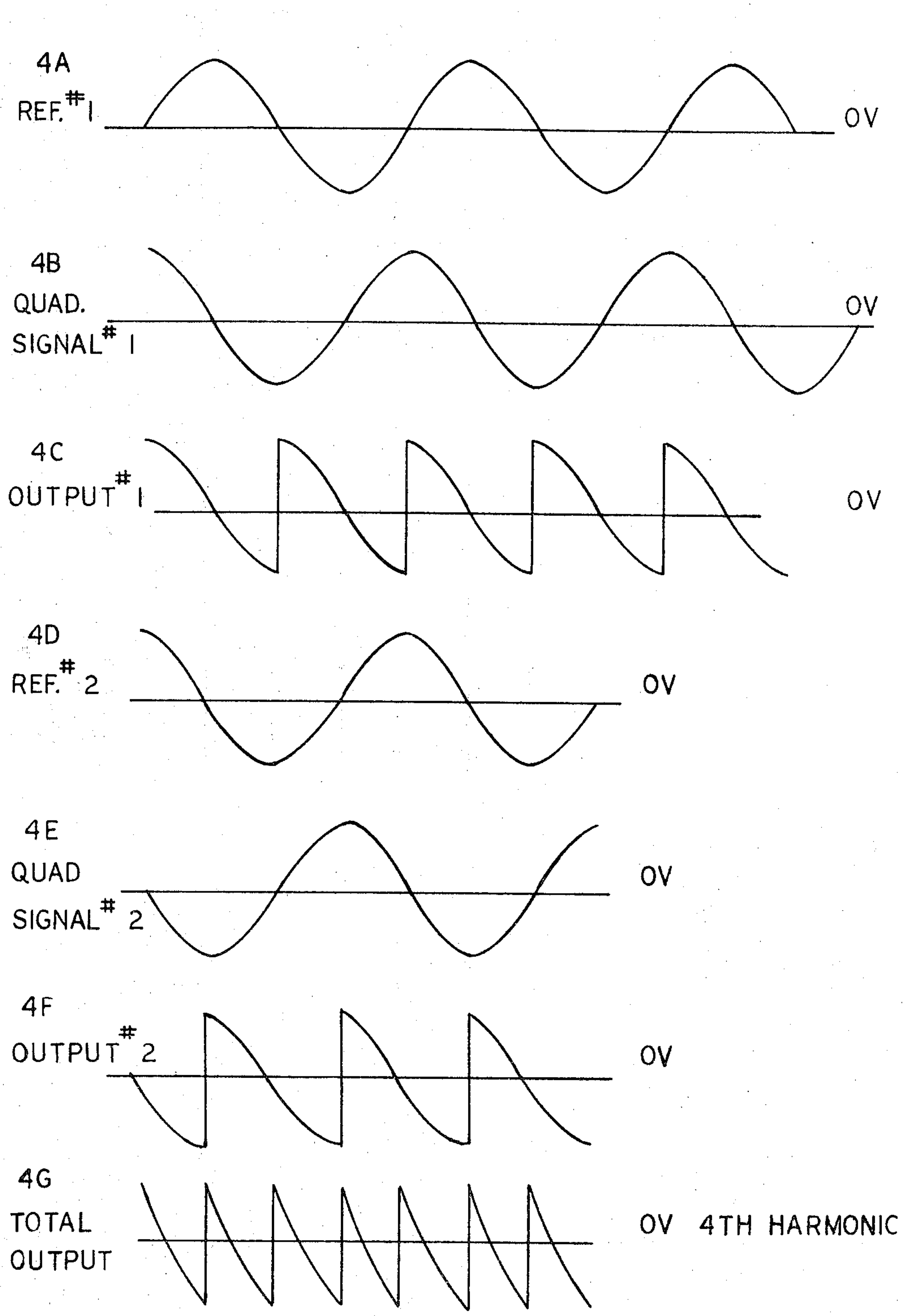
FIG. 4 is a series of voltage versus time waveforms illustrating and improved quadrature rejection obtained by the double demodulator circuit comprising the invention.

FIG. 4 of the drawings is a series of wave forms which depict the improved quadrature rejection obtained by the double demodulation circuit shown in FIG. 1. In FIG. 4A, the wave shape of the 0 degree reference potential applied to the pair of first switching transistors 12 and 13 is plotted. FIG. 4B is a plot of the quadrature component of the 0 degree shifted signal and FIG. 4C is a plot of the resultant quadrature component appearing in the output of the summing amplifier 19. Similarly, FIG. 4D is a plot of the 90° phase shifted reference switching potential applied to the switching transistors 31 and 32. FIG. 4E is a plot of the quadrature component of the 90° phase shifted quadrature signal and FIG. 4F is a plot of the resultant quadrature component appearing in the output of the summing amplifier due to the quadrature signal component shown in FIG. 4E. FIG. 4G is a plot of the total quadrature component appearing in the output of the summing amplifier, and from a consideration of this wave shape, it will be appreciated that the basic quadrature - caused ripple increased in frequency by a factor of 2 since the prime ripple frequency is the fourth harmonic instead of the second harmonic. Since the quadrature signal normally gives a second harmonic noise output, and the response of the double demodulator to quadrature is fourth harmonic with no increase in amplitude, a net increase in signal to noise ratio of about 2 to 1 is realized. Additionally, the DC gain to in-phase signal is doubled, and further improves the signal to noise considerations to the order of 6 decibels. Doubling of the noise frequency plus the doubling of the DC in-phase gain gives an overall improvement in rejection of quadrature by a factor of about 4. A Fourier analysis of the full-wave-rectified output appearing at the output of the summing amplifier is set forth below.

$$(1)\quad e=\frac{2E}{\pi}[1+2/3\ \mathrm{Cos}\ 2\theta-2/15\ \mathrm{Cos}\ 4\theta+2/35\ \mathrm{Cos}\ 6\theta-\ldots]$$

Let $\theta = \omega t$; then:

$$(2)\quad e_1 = \frac{2E}{\pi}[1 + 2/3 \text{ Cos } 2\omega t - 2/15 \text{ Cos } 4\omega t + 2/35 \text{ Cos } 6\omega t - \ldots]$$

Let $\theta = \omega t + 90°$; then:

$$(3)\quad e_2 = \frac{2E}{\pi}[1 + 2/3 \text{ Cos } (2\omega t + 180°) - 2/15 \text{ Cos } (4\omega t + 360°) + 2/35 \text{ Cos } (6\omega t + 180°) - \ldots]$$

Summing (2) $e$ (3) results in:

$$(4)\quad \frac{e_1 + e_2}{2} = \frac{2E}{\pi}[1 - 2/15 \text{ Cos } 4\omega t - 2/63 \text{ Cos } 8\omega t \ldots]$$

From a consideration of equation 4 set forth above, it will be seen that the second and sixth harmonics are completely canceled in the output of the summing amplifier and that the fourth harmonic is the prime ripple term. By a comparison of equation 4 to either equations 2 or 3, it will be seen that the prime ripple term is reduced by a factor of 5 in amplitude and doubled in frequency. By reason of this characteristic, it is possible to completely eliminate the usual demodulator filter capacitor normally employed at the output of a demodulator thereby making possible increased overall microminiaturization of the double demodulator, as well as the overall servosystem which employs the double demodulator as one of its component building blocks.

FIG. 1A of the drawings is a sketch of an alternative form of input, variable magnitude, control circuit for connection to the first and second input circuit comprised by the circuit paths 14, 15 and 33, 35, respectively. With regard to FIG. 1, the circuit shown in FIG. 1A can be substituted for the signal transformer 11 and its associated phase shift network 42, 43 by connecting the two points marked A and B to the correspondingly marked points of the circuit shown in FIG. 1. With the arrangement shown in FIG. 1A the source of input, variable magnitude control signal is connected directly to the terminal marked A and thence to the circuit paths 14 and 15 of the first input circuit. The subcircuit shown in FIG. 1A comprises a T-shaped resistor-capacitor phase shift network with the base of the T network being formed by a resistor 51 that is returned to the reference potential source (ground). The two arms of the T-shaped phase shifting network are comprised by capacitors 52 and 53 with the capacitor 52 having one of its electrodes connected directly to the terminal A. The capacitor 53 has its remaining electrode connected to the terminal marked B which is turn is directly connected to the circuit paths 33 and 35 comprising the second input circuit to the double demodulator. As a result of this arrangement, the input, variable magnitude control signal supplied to the terminal A is supplied directly to the first input circuit comprised by the circuit paths 14 and 15 with no phase shift, and the T-shaped network operates to introduce a 90° phase shift in the signal supplied through the terminal B to the second input circuit comprised by the circuit paths 33 and 35.

The phase shift network shown in FIG. 1A of the drawing may exhibit undesirably low input impedance, and for this reason, it may be desirable to employ a transistor input circuit such as shown in FIG. 1B of the drawings. In FIG. 1B, an NPN junction transistor has its base electrode connected directly to the terminal A to which the input, variable magnitude control signals are supplied. The emitter-collector of the input transistor 55 is connected through respective emitter and collector resistors 56 and 57 across a source of direct current bias potential and a phase shift network is connected across the emitter-collector of the transistor. This phase shift network is comprised by a series connected first resistor 58 and capacitor 59 connected in parallel circuit relationship with a second resistor 61 with the parallel circuit thus formed being connected across the emitter-collector of input transistor 55 through a coupling diode 62 having its cathode connected to the emitter of the input transistor 55. The terminal B is connected to the juncture of the first resistor 58 and capacitor 59 and serves to supply to the second input circuit comprised by the circuit paths 33 and 35 the 90° phase shifted input, variable magnitude control signal.

From a consideration of FIGS. 1, 1A and 1B, it will be seen that the control signal input circuits there employed, all serve to supply the input control signal both directly, and phase-shifted 90° to the double demodulator. The arrangement shown in FIG. 1 requires a transformer or resolver, which in itself is not subject to microminiaturization. For this reason, the circuit arrangements of FIG. 1A or FIG. 1B might be utilized since they are entirely susceptible to mircominiaturization thereby allowing the complete double demodulator to be fabricated largely in monolithic, integrated circuit form. As noted earlier, the circuit of FIG. 1B may be preferred where it is desirable to increase the input impedance to the double demodulator for a specific servo application.

Figure 2:
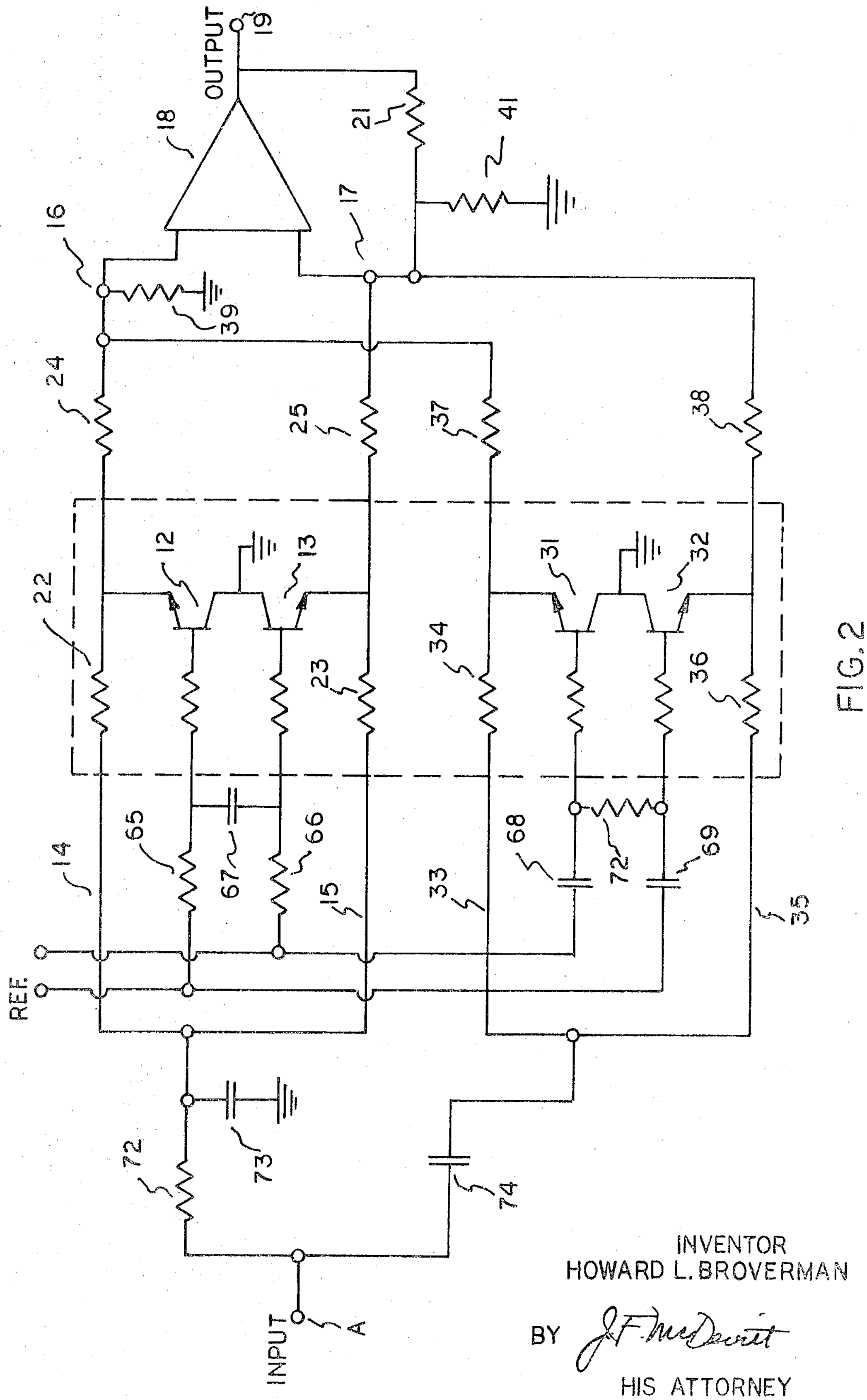
FIG. 2 is a schematic circuit diagram showing still another form of low ripple double demodulator constructed in accordance with the invention.

FIG. 2 of the drawings is a schematic circuit diagram of an embodiment of the invention which is similar in most respects to the double demodulation amplification circuit shown in FIG. 1 with certain exceptions in the manner in which it is implemented. In the double demodulator shown in FIG. 2, the first and second switching potentials are supplied from a single common source of switching potential and further include a first 45° lagging phase shift circuit comprised by the two resistors 65 and 66 and the capacitor 67 for providing a 45° lagging phase shift to the switching potentials supplied to the base of the pair of first alternately operable switching transistors 12 and 13. A second phase shift network comprised by pair of capacitors 68 and 69 and a resistor 71 is connected intermediate the common source of reference switching potential and the base electrodes of the pair of second switching transistors 31 and 32 for introducing a 45° leading phase shift in the reference-switching potential supplied to the base electrode of the pair of second switching transistors 31 and 32. In a similar manner, a 45° lagging phase shift network comprised by a resistor 72 and a capacitor 73 is connected in the circuit path intermediate the input terminal A to which the input, variable magnitude, error control signal is supplied, and the first input circuit comprised by the circuit paths 14 and 15. A 45° leading phase shift network comprised by a capacitor 74 is connected intermediate the input terminal A and the circuit paths 33 and 35 comprising the second input circuit means. As a consequence of this arrangement, it will be appreciated that by reason of the introduction of the 45° lagging phase shift introduced into both the error input signal and the reference-switching potential supplied to the first and second switching transistors 12 and 13, and the 45° leading phase shift introduced into both the error control signal and the switching potential supplied to the pair of second switching transistors 31 and 32, the overall phase difference between the two sets of potential is 90° so that in effect the wave shapes shown in FIG. 3 and FIG. 4 are still applicable in so far as operation of the two circuits is concerned. The circuit arrangement of FIG. 2 may be preferred for those circuit applications where there is no ready source of 90° phase-shifted switching potentials.

From the foregoing description, it can be appreciated that the invention provides a new and improved, double demodulation and amplification circuit which can be fabricated without requiring input or output transformers, or the conventional large filter capacitor. Hence, the double demodulation circuit can be used to extend the band width and improve the stability of gimbal servosystems, etc. in which it is used for the reason that it requires less lag filtering. Further, the double demodulation circuit is susceptible to being fabricated largely in a single, monolithic, microminiaturized integrated circuit chip so that it becomes extremely attractive not only from the standpoint of improved performance as noted above, but also due to its potentially low cost and improved reliability obtained by reason of its monolithic manufacture.

Having described several embodiments of a new and improved double demodulation and amplification circuit having low ripple and subject to integration, it is believed obvious that other modifications and variations of the invention are possible in the light of the above teachings. It is therefore to be understood that changes may be made in the particular embodiments of the invention described which are within the full intended scope of the invention as defined by the appended claims.

I claim:

1. A new and improved double demodulation and amplification circuit comprising a pair of first alternately operable switching means coupled to and controlled by the direct and inverse outputs of a first switching potential, summing amplifier means having direct and inverting input terminals and an output terminal, first input circuit means for supplying a first input variable magnitude control signal to be demodulated and amplified to the respective direct and inverting input terminals of the summing amplifier means, said pair of first switching means being connected across the first input circuit means and being rendered alternately conductive by the switching potential, a pair of second alternately operable switching means coupled to and controlled by a second switching potential having the same waveform as the first switching potential but shifted 90° in phase with respect thereto, and second input circuit means for supplying a second input variable magnitude control signal to the respective direct and inverting input terminals of the summing amplifier means, the second input control signal being similar to the first input control signal but being phase shifted 90° with respect thereto, said pair of second switching means being connected across the second input circuit means and being rendered alternately conductive by the second switching potential whereby a summation of full-wave-rectified and amplified control signals is obtained from the output of the summing amplifier means having improved ripple content and low filtering requirements.

2. A double demodulation and amplification circuit according to claim 1 wherein each pair of the first and second alternately operable switching means have the juncture of the pair of alternately operable switching means thereof connected to a source of reference potential whereby during the alternate conducting intervals of the switching means the respective input signal paths of the input circuit means to the direct and inverse input terminals of the summing amplifier means are effectively returned to the reference potential level.

3. A double demodulation and amplification circuit according to claim 2 further including a respective summing resistor connected in each path of the first and second input circuit means intermediate the first and second switching means and the direct and inverse input terminals of the summing amplifier means, respectively, for summing together and buffering the respective rectified outputs of the first and second switching means.

4. A double demodulation and amplification circuit according to claim 3 wherein the first and second pairs of switching means are comprised of switching transistors operated in the on-off switching mode with the first and second switching potentials comprising sinusoidal and cosinusoidal wave shape switching potentials applied to the base electrodes of the switching transistors.

5. A double demodulation and amplification circuit according to claim 4 wherein the first and second switching potentials comprise two separate sources of switching potentials having the same wave shape but shifted 90° with respect to each other, and said first and second input circuit means are connected to a common source of input variable magnitude control signals with a 90° phase shift circuit interposed in the second input circuit path intermediate the common source of control signals and the pair of second alternately operable switching means.

6. A double demodulation and amplification circuit according to claim 5 wherein the common source of input variable magnitude control signals comprises a common control signal input transformer including a primary winding connected to a source of variable magnitude control signals and inductively coupled to a secondary winding having an intermediate tap point returned to the reference potential source, a direct 0 degree phase shift connection intermediate one terminal of the secondary winding and the first input circuit means, and a 90° phase shift connection intermediate the remaining terminal of the secondary winding and the second input circuit means.

7. A double demodulation and amplification circuit according to claim 5 wherein the common source of input variable magnitude control signals comprises a T-shaped resistor-capacitor phase-shift network with the base of the T being by a resistor that is returned to the reference potential source and the two arms of the T-shaped network being comprised by the capacitors, a source of variable magnitude control signals connected directly to the end of the one arm of the T-shaped network and to the first input circuit means, and the second input circuit means being connected to the end of the remaining arm of the T-shaped network whereby a 90° shift in the phase of the variable magnitude input control signal is provided.

8. A double demodulation and amplification circuit according to claim 5 wherein the common source of input variable magnitude control signals comprises an input NPN junction transistor having its base electrode connected directly to a source of variable magnitude control signals and to the first input circuit means, the emitter-collector of the input transistor being connected through respective emitter and collector resistors to a source of bias potential, and a phase shift network connected across the emitter-collector of the input transistor, the phase-shift network comprising a series connected first resistor and capacitor connected in parallel circuit relationship with a second resistor, the parallel circuit thus formed being connected across the emitter-collector of the input transistor through a coupling diode having its cathode connected to the emitter of the input transistor, and the second input circuit means connected to the juncture of the series connected first resistor and capacitor.

9. A double demodulation and amplification circuit according to claim 4 wherein the first and second switching potentials comprise a single common source of switching potential and further including means for providing a 45° lagging phase shift to the switching potentials supplied from the common source to the pair of first alternately operable switching means, means for providing a 45° leading phase shift to the switching potentials supplied from the common source to the pair of second alternately operable switching means, means for providing a 45° lagging phase shift to the input variable magnitude control signals supplied to the first input circuit means, and means for providing a 45° leading phase shift to the input variable magnitude control signals supplied to the second input circuit means.